（12） United States Patent
Routh, Jr. et al.

(10) Patent No.: US 11,355,313 B2
(45) Date of Patent: Jun. 7, 2022

(54) LINE-BASED ENDPOINT DETECTION

(71) Applicant: FEI Company, Hillsboro, OR (US)

(72) Inventors: Brian Routh, Jr., Hillsboro, OR (US);
Brad Larson, Hillsboro, OR (US);
Aditee Shrotre, Mountain View, CA (US); Oleg Sidorov, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/917,727

(22) Filed: Jun. 30, 2020

(65) Prior Publication Data

US 2021/0407765 A1 Dec. 30, 2021

(51) Int. Cl.
*H01J 37/30* (2006.01)
*H01J 37/31* (2006.01)
*G01N 23/2251* (2018.01)

(52) U.S. Cl.
CPC ...... *H01J 37/3005* (2013.01); *G01N 23/2251* (2013.01); *H01J 37/31* (2013.01); *G01N 2223/07* (2013.01); *G01N 2223/40* (2013.01); *G01N 2223/507* (2013.01); *H01J 2237/30466* (2013.01)

(58) Field of Classification Search
CPC ...... H01J 37/3005; H01J 37/31; H01J 37/302;
H01J 37/3023; H01J 37/3053; H01J 37/3056; H01J 2237/30466; G01N 23/2251; G01N 2237/06; G01N 2237/40; G01N 2237/507
See application file for complete search history.

(56) References Cited

U.S. PATENT DOCUMENTS

| | | | |
|---|---|---|---|
| 5,622,899 A * | 4/1997 | Chao | G03F 7/16 257/E21.024 |
| 8,173,451 B1 * | 5/2012 | Tian | H01J 37/32963 438/14 |
| 8,306,264 B2 * | 11/2012 | Fujii | H01L 21/67282 382/103 |
| 9,412,559 B2 * | 8/2016 | Tanner | H01J 37/3045 |
| 2014/0284307 A1 * | 9/2014 | Asahata | H01J 37/3056 216/60 |
| 2016/0126060 A1 * | 5/2016 | Fuller | H01J 37/3005 250/492.3 |

* cited by examiner

*Primary Examiner* — David E Smith (57) ABSTRACT

Apparatuses and methods directed toward endpoint detection are disclosed herein. An example method at least includes forming a plurality of lines on a top surface of a sample; removing, a plurality of times, material from a working surface of the sample, the working surface different than the top surface; imaging, a plurality of times, the sample to at least capture the plurality of lines; and determining an endpoint based on a relative spatial characteristic between two or more lines of the plurality of lines.

23 Claims, 5 Drawing Sheets

LINE-BASED ENDPOINT DETECTION

FIELD OF THE INVENTION

The invention relates generally to process endpoint detection, and specifically to endpoint detection using relative line characteristics to indicate the endpoint for lamella preparation in a charged particle microscope.

BACKGROUND OF THE INVENTION

Sample preparation using charged particle microscopes, such as dual beam microscopes that include both an ion column and an electron column, typically results in nanometer thin lamellae that may be imaged in a transmission electron microscope, for example. Such preparation is delicate, especially for lamellas that are less than 10 nm thick after formation. Such lamellas are formed by using the ion beam to mill away material from both sides of the sample in order to obtain the thin lamella. However, knowing or determining when to cease milling is a critical aspect and difficult to do with electron-based images. While there are techniques to aid endpoint detection, many use characteristics of the sample to aid in detection. Such characteristics, however, may be unhelpful if they are hard to image or do not have good defining features to use as the endpoint detection. Samples with no structures to aid in guidance are even more difficult to use. As such, a new endpoint detection technique is desirable.

SUMMARY

Apparatuses and methods directed toward endpoint detection are disclosed herein. In most embodiments, lines formed on sample and their relative physical relationship are used to detect the endpoint location, which may be monitored and detected either manually or using computer algorithms. An example method at least includes forming a plurality of lines on a top surface of a sample; removing, a plurality of times, material from a working surface of the sample, the working surface different than the top surface; imaging, a plurality of times, the sample to at least capture the plurality of lines; and determining an endpoint based on a relative spatial characteristic between two or more lines of the plurality of lines.

An example apparatus at least includes an ion beam column coupled to provide an ion beam; an electron beam column coupled to provide an electron beam, a sample arranged to receive the ion and electron beams, and a controller coupled to control the ion and electron beams. The controller includes or is coupled to non-transitory computer readable medium storing instructions that, when executed by the controller, cause the apparatus to form, with the ion beam, a plurality of lines on a top surface of a sample, remove, a plurality of times with the ion beam, material from a working surface of the sample, the working surface different than the top surface, image, a plurality of times with the electron beam, the sample a plurality of times to at least capture the plurality of lines, each of the occurring plurality of times occurring between at least one removal step, and determine an endpoint based on a relative spatial characteristic between two or more lines of the plurality of lines.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of dualbeam charged particle microscope implementing line-based endpoint detection techniques. The techniques include formation of lines on a surface of a sample that are used to determine when to stop removing material from the sample, i.e., endpoint detection. Such lines may have a relative spatial characteristic that is monitored and measured to determine the process endpoint, such as a depth of the trench forming the lines, or a distance between multiple sets of lines meeting a condition. These techniques will be described in further detail below.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

As noted above, endpoint detection in lamella formation is difficult. Additionally, automation of endpoint detection is more difficult. Such difficulties are partially due to the variability in process and sample type, which must be accounted for. Such variability makes automating endpoint detection difficult due to the need to design for most, if not all, variables. What is desired is an endpoint detection technique that is agnostic to sample type, microscope differences, process variables, etc., and that is easily detectable in acquired images and post-acquisition analysis.

One solution to this problem, especially with regards to automation, is to use lines formed on a surface of the sample as the basis of the endpoint detection. For example, two lines may be formed that are laterally offset and overlapping at their ends so that their depth, if they are trenches for example, are the same in an area of the sample desired to be the endpoint of sample processing. Alternatively, the lines may be formed at different angle to one another and the changing distance between the lines may be monitored for a condition, such as equal distance. This equal distance indicates the endpoint to the process and is arranged with an edge of a region of interest, for example.

Such techniques may aid in automation due to various characteristics of the techniques. For example, while the absolute depth of the lines will vary by sample material and beam shape, the depth of the lines should be equal at the line endpoints, providing a sample- and beam-insensitive reference point. In this way this marking strategy is self-calibrating and leverages the high accuracy of the deflection system of the microscope. Additionally, the SEM images collected during processing, e.g., thinning, can be run through a network/machine learning pipeline, a regular pattern match type machine-vision, and/or image processing algorithms to segment/identify and measure the lines. The segmented pixels can be analyzed directly or they can be used to place edge- or line-finders to measure the line depth. When the line depths match, the SW will tell the system to stop milling.

Figure 1:
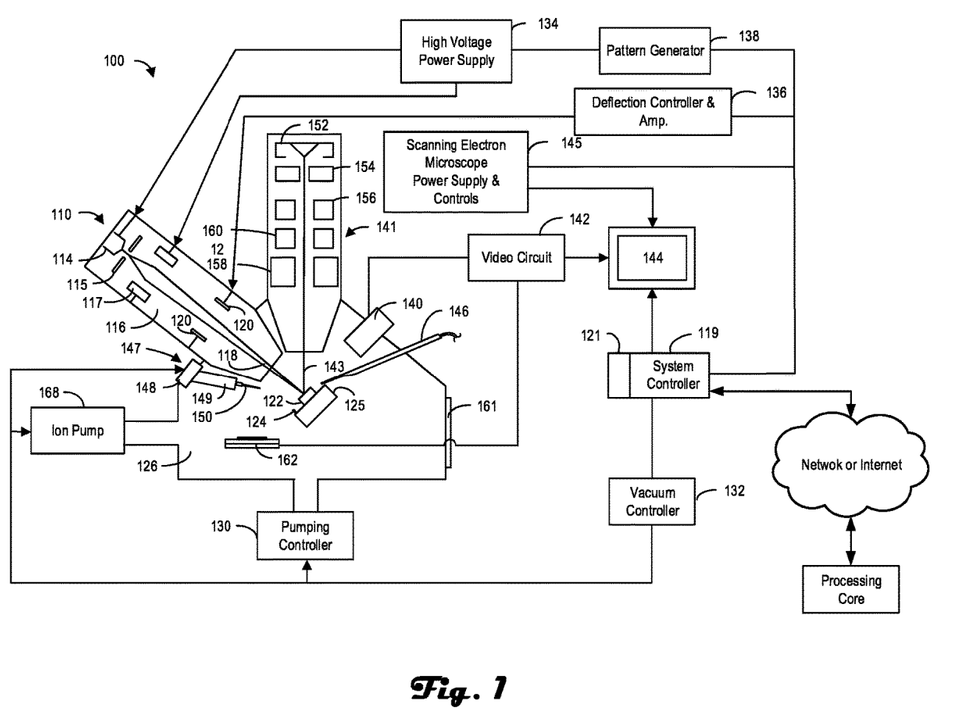
FIG. 1 is an illustration of a dual beam system for performing line-based endpoint determination in accordance with an embodiment of the present disclosure.

FIG. 1 is an illustration of a dual beam system 100 for performing line-based endpoint determination in accordance with an embodiment of the present disclosure. System 100 includes a vertically mounted scanning electron microscope (SEM) column and a focused ion beam (FIB) column mounted at an angle with respect to the SEM column. The system 100 may be used to image and alter, e.g., mill or deposit onto, samples. In some embodiments, system 100 is used to form lamella for imaging in a transmission electron microscope, for example, where the lamella is to have a region of interest (ROI) located therein. However, to form the lamella to include the ROI, milling endpoints are needed to help guide the milling operation, where the endpoints help determine when to stop the milling process. One technique to use for endpoint determination is to include two or more lines on a top surface of the sample, where a relative spatial characteristic between the two or more lines is monitored. When the relative spatial characteristic equals a threshold value or pre-established condition, the endpoint has been reached or will be reached in a subsequent mill process. While an example of suitable hardware is provided below, the disclosed techniques are not limited to being implemented in any particular type of hardware.

A scanning electron microscope (SEM) 141, along with power supply and control unit 145, is provided with the dual beam system 100. An electron beam 143 is emitted from a cathode 152 by applying voltage between cathode 152 and an anode 154. Electron beam 143 is focused to a fine spot by means of a condensing lens 156 and an objective lens 158. Electron beam 143 is scanned two-dimensionally on the specimen by means of a deflection coil 160. Operation of condensing lens 156, objective lens 158, and deflection coil 160 is controlled by power supply and control unit 145.

Electron beam 143 can be focused onto sample 122, which is on movable X-Y stage 125 within lower chamber 126. When the electrons in the electron beam strike sample 122, secondary electrons are emitted. These secondary electrons are detected by secondary electron detector 140. STEM detector 162, located beneath the TEM sample holder 124 and the stage 125, can collect electrons that are transmitted through the sample mounted on the TEM sample holder as discussed above.

Dual beam system 100 also includes focused ion beam (FIB) system 110 which comprises an evacuated chamber having an upper neck portion 112 within which are located an ion source 114 and a focusing column 116 including extractor electrodes and an electrostatic optical system. The axis of focusing column 116 is tilted with respect to the axis of the electron column, such as by 52° in some embodiments. The ion column 112 includes an ion source 114, an extraction electrode 115, a focusing element 117, deflection elements 120, and a focused ion beam 118. Focused ion beam 118 passes from ion source 114 through focusing column 116 and between electrostatic deflection means schematically indicated at 120 toward substrate 122, which comprises, for example, a semiconductor device positioned on movable X-Y stage 125 within lower chamber 126.

Stage 125 can preferably move in a horizontal plane (X and Y axes) and vertically (Z axis). Stage 125 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 161 is opened for inserting substrate 122 onto X-Y stage 125 and also for servicing an internal gas supply reservoir, if one is used.

An ion pump 168 is employed for evacuating neck portion 112. The chamber 126 is evacuated with turbomolecular and mechanical pumping system 130 under the control of vacuum controller 132. The vacuum system provides within chamber 126 a vacuum of between approximately 1×10-7 Torr and 5×10-4 Torr. If an etch assisting, an etch retarding gas, or a deposition precursor gas is used, the chamber background pressure may rise, typically to about 1×10-5 Torr.

The high voltage power supply provides an appropriate acceleration voltage to electrodes in focusing column 116 for energizing and focusing ion beam 118. When it strikes sample 122, material is sputtered, that is physically ejected, from the sample. Alternatively, ion beam 118 can decompose a precursor gas to deposit a material.

High voltage power supply 134 is connected to ion source 114 as well as to appropriate electrodes in ion beam focusing column 116 for forming an approximately 0.5 keV to 60 keV ion beam 118 and directing the same toward a sample. Deflection controller and amplifier 136, operated in accordance with a prescribed pattern provided by pattern generator 138, is coupled to deflection plates 120 whereby ion beam 118 may be controlled manually or automatically to trace out a corresponding pattern on the upper surface of substrate 122. In some systems the deflection plates are placed before the final lens, as is well known in the art. Beam blanking electrodes (not shown) within ion beam focusing column 116 cause ion beam 118 to impact onto blanking aperture (not shown) instead of substrate 122 when a blanking controller (not shown) applies a blanking voltage to the blanking electrode.

In some embodiments, the ion source 114 is a liquid metal ion source that typically provides a metal ion beam of gallium. The source typically is capable of being focused into a sub one-tenth micrometer wide beam at substrate 122 for either modifying the substrate 122 by ion milling, enhanced etch, material deposition, or for the purpose of imaging the substrate 122. In other embodiments, the ion source 114 is a plasma-based ion source capable of providing ion beam 118 formed of a variety of ions, such as Xenon, Oxygen, Nitrogen, Argon, etc., and can be used for the same purposes as above, such as ion milling, enhanced etching, material deposition, and/or imaging.

A charged particle detector 140, such as an Everhart Thornley or multi-channel plate, used for detecting secondary ion or electron emission is connected to a video circuit 142 that supplies drive signals to video monitor 144 and receiving deflection signals from a system controller 119. The location of charged particle detector 140 within lower chamber 126 can vary in different embodiments. For example, a charged particle detector 140 can be coaxial with the ion beam and include a hole for allowing the ion beam to pass. In other embodiments, secondary particles can be collected through a final lens and then diverted off axis for collection.

A micromanipulator 147 can precisely move objects within the vacuum chamber. Micromanipulator 147 may comprise precision electric motors 148 positioned outside the vacuum chamber to provide X, Y, Z, and theta control of a portion 149 positioned within the vacuum chamber. The micromanipulator 147 can be fitted with different end effectors for manipulating small objects.

A gas delivery system 146 extends into lower chamber 126 for introducing and directing a gaseous vapor toward substrate 122. For example, iodine can be delivered to enhance etching, or a metal organic compound can be delivered to deposit a metal.

System controller 119 controls the operations of the various parts of dual beam system 100. Through system controller 119, a user can cause ion beam 118 or electron beam 143 to be scanned in a desired manner through commands entered into a conventional user interface (not shown). Alternatively, system controller 119 may control dual beam system 110 in accordance with programmed instructions stored in a memory 121. In some embodiments, dual beam system 100 incorporates image recognition software to automatically identify regions of interest, and then the system can manually or automatically determine a processing endpoint in accordance with the disclosure. In other embodiments, acquired images may be processed by a machine learning algorithm or neural network to determine the endpoint through image segmentation and analysis, for example. In such an embodiment, the machine learning algorithm or the neural network model may be performed by controller 119 or by a processing core coupled via a network or the internet.

In operation, the controller 119 automatically or via user control may establish lines on a top surface of sample 122, which are then used to determine when to stop processing the sample 122 with respect to lamella formation. For example, an ROI may be mapped onto the top surface of the sample 122, which may be an outline for the lamella or an area within the lamella, then two or more lines may be formed on the top surface to establish where the edges of the ROI are located. These lines, which may be trenches milled into the surface or protrusions deposited on the top surface, may be arranged so that a relative spatial characteristic between at least two of the lines indicates an endpoint to material removal. In some embodiments, the endpoint may be an edge of the lamella, but in other embodiments the endpoint may be an edge of the ROI. The lamella may then be used for further analysis, such as in a transmission electron microscope (TEM). In some embodiments, the relative spatial characteristic may be a depth or height of two adjacent lines. In other embodiments, the relative spatial characteristic may be a distance between two or more of the lines, or a ratio of such distances. In both embodiments, however, the lines are formed on the top surface in such a way where the depths/heights or distances are aligned to a desired, pre-established endpoint, such as the edge of the ROI. See FIGS. 2 and 3 for examples.

For further illustration, after the lines are formed on the top surface of sample 122, the ion beam 118 is used to remove sample material to uncover/form a side (e.g., working surface) of the sample in order to form a lamella that includes the desired ROI. The working surface may be at a normal angle to the top surface where the lines are formed, or some acute or obtuse angle thereto. The removal of the material may be by ion beam milling or ion beam assisted etching, or a combination thereof. In some embodiments, the energy of the ion beam may be adjusted as the working face moves closer to the desired endpoint, such as from 30 keV down to 0.5 keV, for example. In other embodiments, a first ROI and endpoint process may be performed using a high energy ion beam, such as 30 keV, where the material removal is halted at the edge of the first ROI using the techniques disclosed herein. Subsequently, a second ROI may be targeted using a lower ion beam energy and additional or the same endpoint lines on the top surface. The second ROI may be smaller than the first so that a thinner lamella is formed using lower energy ions. In general, the line-based endpoint detection techniques disclosed herein may be used repetitively on a single sample 122 to obtain a desired lamella.

As sample material is removed, images are acquired of the working face. These images are then analyzed, either using an algorithm or manually, to determine if the relative spatial characteristic satisfies the preestablished condition, e.g., either of the same depth/height or equidistant/distance ratio. If not, additional material removal occurs. In some embodiments, if the condition is met, then the material removal is halted. In other embodiments, the condition being satisfied indicates that an additional material removal step will provide the desired endpoint. This material removal step can be at a same or lower milling energy, for example, than the previous material removal steps. Once the endpoint is reached, processing of the lamella may be complete or an opposing side of the lamella may then be processed.

Figures 2A, 2B:
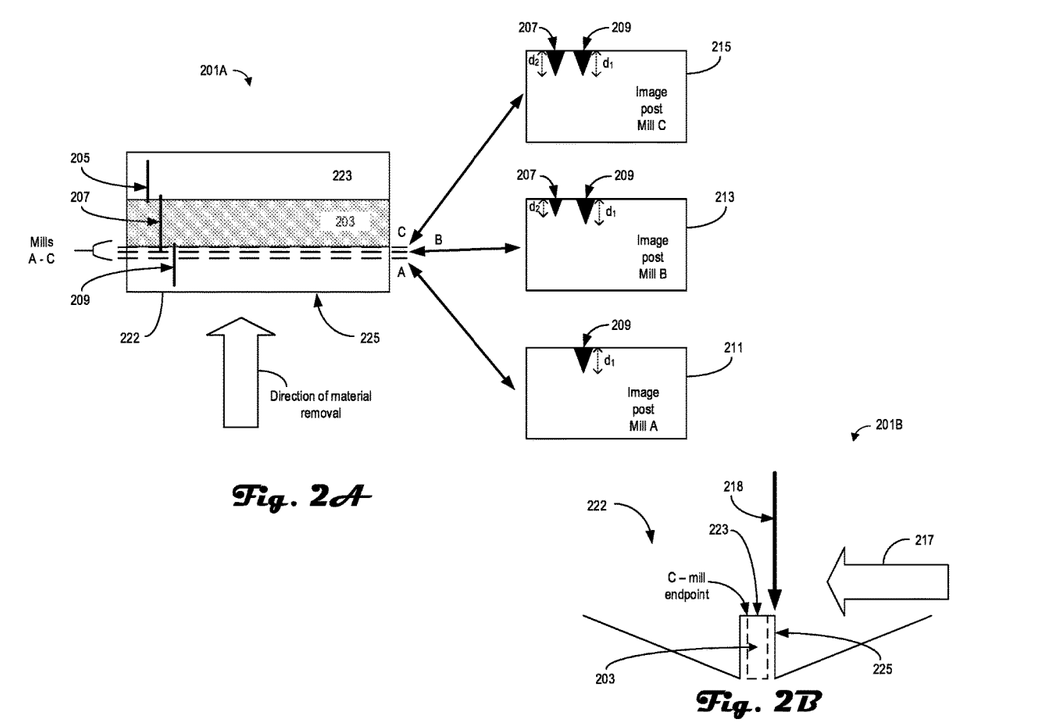
FIG. 2A is example sequence of line-based endpoint determination in accordance with an embodiment of the present disclosure.
FIG. 2B is an illustration of sample orientation and milling in accordance with an embodiment of the present disclosure.

FIG. 2A is example sequence 201A of line-based endpoint determination in accordance with an embodiment of the present disclosure, and FIG. 2B is an illustration of sample orientation and milling 201B in accordance with an embodiment of the present disclosure. The endpoint detection sequence 201A can be performed on any dualbeam charged particle microscope, such as system 100, and may be used as part of a process to form a lamella. The sequence of process steps of sequence 201A may be performed on one or two sides of a lamella and each use of the sequence may involve the formation of a series of lines on a top surface of the sample and the image of a cross-section of at least a subset of those lines to determine when to cease processing, e.g., an endpoint to material removal.

FIG. 2A is an example illustration of endpoint detection using a series of lines 205, 207 and 209 formed on a top surface 223 of sample 222, where at least one end of each line is arranged to extend beyond an end of at least one other line. For example, one end of line 209 extends beyond an end of line 207. As used herein, the term "extend beyond means there is adjacent overlap between two lines for a limited length such that a deepness, for example, of both lines is the same at least for a length of the limited length where there is overlap. Additionally, the lines are formed to be laterally offset from one another so that each line is independently identifiable within an acquired image, and to avoid the lines merging into one structure, which would hamper or eliminate the endpoint detection technique disclosed herein.

The sample illustration 201B of FIG. 2B shows the ion beam 218 arriving at the sample 222 in an orientation normal to a top surface 223 of the sample 222. While ion beam 218 is shown as arriving at the top surface 223 in a normal configuration, such orientation is not required and nor is it limiting, and any other orientation, such as at an angle with respect to working surface 225, is within the bounds of the present disclosure and contemplated herein. As ion beam 218 mills away a thickness of material from surface 225, material is removed from the sample in furtherance of forming a lamella that is defined by or includes ROI 203. Periodically, such as after every mill operation or after any number of mill operations, such as 2, 3, 4 and so on, an image is acquired of working surface 225, which may be performed using electron beam 217. Alternatively, images may be acquired from secondary electrons generated during a mill operation. In either acquisition strategy, the images may be analyzed, either automatically using an algorithm, such as a deep learning algorithm or standard image processing algorithm, or manually to determine if the lines where they overlap are of similar depths. If so, then the milling process is halted or one additional mill is performed, else additional mills and image acquisitions are performed until the depths are equal. In some embodiments, as the depths of the lines become closer in depth, images are acquired more frequently than if the line depths are more unequal.

The sequence 201A shows a top surface 223 of sample 222 with ROI 203 indicated by the textured and outlined box. Additionally, three parallel and laterally offset lines 205, 207 and 209 have been formed on top surface 223, with at least one end of each of the lines 205-209 overlapping/extending beyond each other. The area where the lines overlap can be located at a desired endpoint, such at the edge of ROI 203, and monitored for during material removal. Once the overlapping area is imaged, material removal processes may be stopped.

Before any material removal, e.g., milling, is performed to isolate ROI 203, the three lines 205-209 are formed on the top surface of the sample. As noted, the lines 205-209 may be milled into the top surface 223 or deposited on the top surface 223. In either example, it is desirable that the lines are formed in the same way so that their depths or heights are similar at least where there is overlap and in the location of the desired endpoint. It is the similar depths/heights that will be monitored for to determine where the endpoint is located. Additionally, the length of the overlap should be long enough to include a portion of each line at full depth, since the lines may have varying depths proximate their respective ends. With regards to how the lines are formed, the same ion beam current and energy, beam size, raster speed, e.g., dwell time, should be the same for each of the three lines 205-209. Using the same formation parameters, the lines should have nearly identical characteristics, which allows for self-calibration of the endpoint detection. In some embodiments, the lines are formed directly in or on top surface 223 of sample 222. However, in other embodiments, various metallic and/or insulative protective layers (not shown) may be formed on top surface 223, and then the lines 205-209 are formed in or on the protective layers. In such embodiments, the protective layers are formed over ROI 203.

As the sample is milled, in the direction of the arrow for example, a layer of the working surface 225 is removed by the ion beam 218 impinging roughly normal to the working surface 225. After one or more layers have been removed, the working surface 225 is imaged with electron beam 217, for example. The acquired image may then be processed using one or more image processing methods to determine if one or two lines, trenches in the acquired image for example, are visible. If two lines are visible, then the image processing determines if they are at a same depth. In this embodiment, the endpoint is reached when the lines are of equal depth. If the lines are not at the same depth, then another layer is removed, and the imaging and analysis is reiterated. As noted, once the lines are of equal depth, the processing stops due to reaching the endpoint. In some embodiments, however, one or more low energy polishing type mills may be performed on the working surface to remove/reduce any damage layer.

To further illustrate, as the working surface 225 is milled in the direction of the arrow, images of the working surface 225 are periodically acquired. At location A, for example, the acquired image 211 shows a single line 209, e.g., a trench in cross-section, of depth $d_1$. Since the acquired image shows only a single line 209, milling continues. At location B, the acquired image 213 shows two lines 209 and 207, e.g., as trenches in cross-section, but line 207 is shallower, e.g. of depth $d_2$, than line 209, e.g., of depth $d_1$. Based on such image 213, milling continues. At location C, the acquired image 215 shows that both lines 207 and 209 are at equal depths, e.g., $d_2$ equals $d_1$. The lines 207 and 209 being at equal depths indicates the endpoint to the milling, and processing stops. As noted, a follow on polishing mill step may additionally be performed to remove any surface damage.

If the opposite side of the ROI 203 has yet to be milled to, the process may then be repeated to form the lamella indicated by ROI 203. While processing the opposing side of ROI 203, the overlap area of lines 205 and 207 will be monitored to detect the endpoint, e.g., edge of ROI 203.

FIGS. 3A through 3E are an illustrative process sequence 301 for line-based endpoint detection in accordance with an embodiment of the present disclosure. The line-based endpoint detection sequence of FIGS. 3A through 3E is an alternative or additional technique as that described in FIG. 2A. The sequence of FIG. 3 use a plurality of lines formed at angles and the distance between three of the lines is monitored to determine a process endpoint. For example, a distance between two of the lines is compared to a distance between two other lines to determine the endpoint, which may be based on the distances being equal or satisfying a predefined ratio. As in FIG. 2, the lines of FIG. 3 are formed so that a predetermined distance between the lines coincides with the desired endpoint, such as an edge of a lamella or ROI 303. The sequence of FIGS. 3A through 3E may be performed on a dual-beam microscope system, such as system 100 for example.

Figures 3A, 3B:
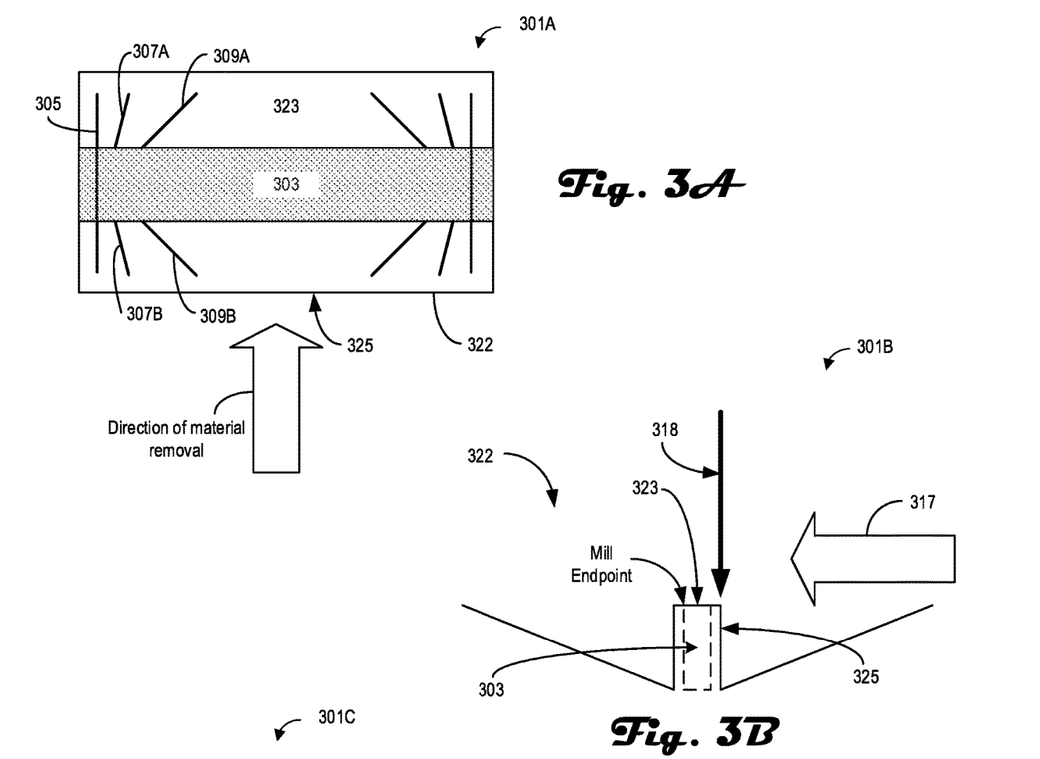
FIGS. 3A through 3E are an illustrative process sequence for line-based endpoint in accordance with an embodiment of the present disclosure

FIG. 3A is a top view of a sample 322 having an ROI 303 designated in the textured box. Additionally, lines 305, 307 and 309 have been formed as disclosed herein on the top surface 323. The lines 305-309 are shown on both sides of the sample 322, but this is not necessary. However, including lines on both sides of the sample 322 may allow additional analysis to be performed, which will be discussed in more detail below. The line 305 extends through the ROI 303 and is formed perpendicular to the ROI 303. Lines 307 and 309 are each formed at different angles to line 305. In some embodiments, however, lines 307 and 309 may be at different angles to line 305 and/or to each other. For example, lines 307 and 309 may be formed perpendicular to each other. In other embodiments, line 305 may be omitted and only lines 307 and 309 formed at various angles to one another may be used, where the various angles include any angle between 0 add 90°. While lines 307 and 309 are shown to begin at the edge of ROI 303, such arrangement is not necessary and the lines could extend to a point within ROI 303 even if parts A and B of each join at a point. The distances between adjacent ones of the lines are monitored to determine when to stop processing sample 322. For example, a distance between two of the lines, if pre-known and aligned with the edge of ROI 303, may be used for endpoint determination. In such an example, only two lines are necessary. On the other hand, including an extra line that provides two gaps/distances to measure may allow for additional confidence in the measurement and some immunity to error. Alternatively, if the distance is not pre-known but the lines are formed so that the gap between the lines aligns with the edge of ROI 303, then at least three lines are needed to determine the endpoint.

In some embodiments, as noted, the location of where lines 307 and 309 intersect with the edge of ROI 303 and the distance between them is predetermined, or at least measured prior to any material removal, since this location is the desired endpoint. Additionally, the intersection of lines 307 and 309 with the edge of ROI 303 is also formed so that the distance between lines 305 and 307 and the distance between lines 307 and 309 are known. As such, a condition is established based on the distances forming a desired ratio or becoming equal so that an algorithm or a user can monitor these distances to determine when to halt processing, i.e., the distances establish the monitoring condition for the desired endpoint. FIG. 3B, which is a reproduction of FIG. 2B, shows how the sample 322 is processed to excavate the ROI 303 from the sample 322 for further analysis, such as in a TEM. Since FIG. 3B has already been discussed in detail, reproduction of the discussion is omitted for sake of brevity.

Figure 3C:
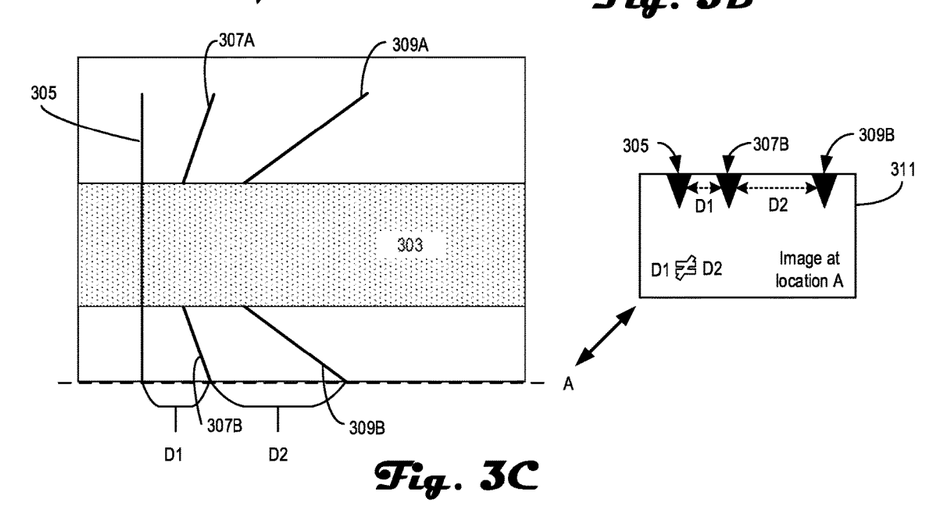

FIG. 3C shows the top surface 323 and an image 311 of the working surface 325 after removing material to location A. At location A, the distance between line 305 and line 307B is D1 while the distance between line 307B and 309B is distance D2. In the embodiment of FIG. 3, the endpoint is located when D1 and D2 equal. As such, location A is not the endpoint since D1 does not equal D2. It should be noted that the embodiment of FIG. 3 may not require images of the working surface to be used to monitor for the endpoint since an image of the top surface 323 can provide the needed information regarding the distances between the lines 305-309. However, images of the working surface 325 may be used in addition to or alternatively to the top surface 323. Since the distances D1 and D2 are not equal, more material is removed from the working surface 325.

Figure 3D:
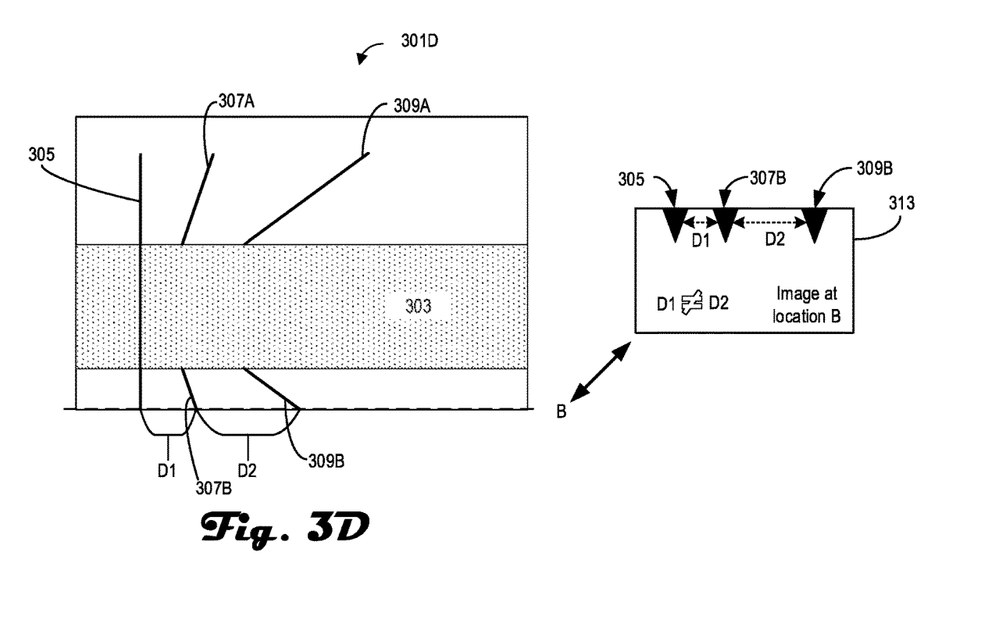
Figure 3E:
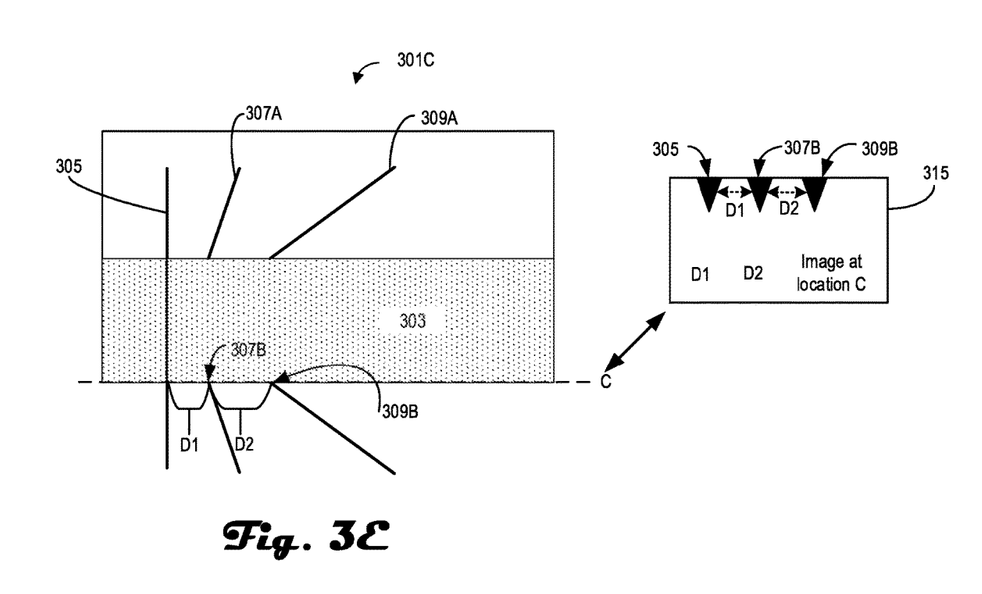

FIG. 3D shows the progression of material removal from location A shown in FIG. 3C to location B. While the distances D1 and D2 are becoming closer in value, they are not equal. As a result, additional material should be removed from working surface 325. FIG. 3E shows the material removal to location C. At location C, distances D1 and D2 are equal, which indicates the endpoint has been reached. It should be noted that while the distances D1 and D2 being equal indicates the endpoint, in other examples a ratio of the distances equaling some predetermined value may be used to determine the endpoint location. As such, additional material removal may be halted and the processing may be repeated on the opposing side of ROI 303. In some embodiments, however, a polishing mill may be performed to smooth the working surface 325 and remove any crystalline damage, for example.

As noted above, the lines on one end of the ROI 303 may only be needed for endpoint detection. However, if lines on both ends of ROI 303 are imaged and analyzed, additional information may be observed, such as whether the material removal of the working surface 225 is proceeding in a planar fashion. For example, if distances between the lines 305-309 are measured on both ends of ROI 303, then a determination of the planarity of the working surface can be determined by comparing distances D1 and D2 from one side to the other. If the distances are substantially equal, then the working surface is planar. If, on the other hand, the distances are different, then the amount of difference can indicate a degree of angle the working surface 225 is being milled. As such, such angle to the working surface can be remedied by adjusting the milling parameters.

Figure 4:
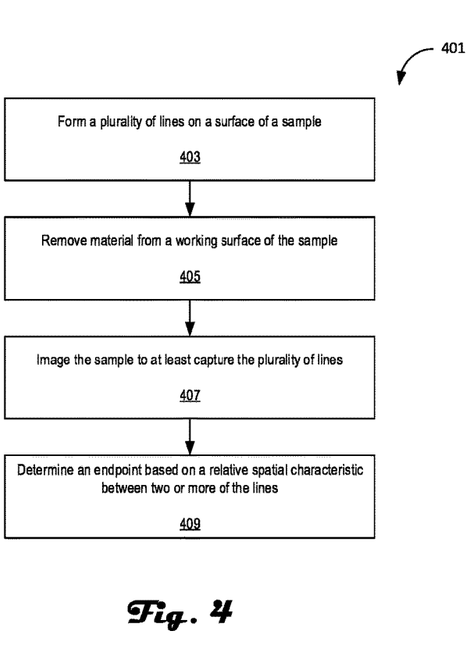
FIG. 4 is an example method 401 for line-based endpoint detection in accordance with a disclosed embodiment.

FIG. 4 is an example method 401 for line-based endpoint detection in accordance with a disclosed embodiment. The method 401 may be implemented by a dualbeam charged particle microscope, such as system 100, for example, and may implement either of the embodiments of sequence 201 or 301. The method 401 may be used to form a lamella out of a semiconductor wafer or sample, for example, which may then be mounted to a TEM grid for imaging in a TEM.

The method 401 may begin at process block 403, which includes forming a plurality of lines on a surface of a sample. The lines may be formed using an ion beam, such as ion beam 118, and may either be formed by milling a trench in the top surface of the sample or by depositing a line on the top surface. Additionally, the lines may be arranged as three laterally offset lines with overlapping ends, as shown in FIG. 2A. In such an embodiment, the area where at least two of the lines overlap is aligned with a desired process endpoint, such as the edge of an ROI or an edge of a lamella. Alternatively, or additionally, the lines may be formed as shown in FIG. 3A, where there is one line perpendicular to an ROI and two additional lines formed at different angles to the perpendicular line. In such an embodiment, the angled lines may be separated by a known amount at the edge of the ROI, or at the edge of a lamella.

Process block 403 may be followed by process block 405, which includes removing material from a working surface of the sample. The working surface may be at an angle to the top surface. The removal of the material may be milled away using an ion beam, such as ion beam 118, or may be etched away using gas-assisted ion-induced etching, for example. however, the method of material removal is non-limiting and any method may be used, such as a laser, microtome, diamond blade, etc.

Process block 405 may be followed by process block 407, which includes imaging the sample to at least capture the plurality of lines. The sample may be imaged using a scanning electron microscope (SEM) or by an SEM column in a dual beam microscope, for example. The surface of the sample captured in the images may be determined by the line strategy implemented. For example, if three laterally offset and overlapping lines are used, an image of the working surface to capture the cross-section of the lines may be used since the depth or height of adjacent lines in the overlap region is needed for the endpoint determination. On the other hand, if the angled line strategy is implemented, images of either the working surface or the top surface may be use to determine the distance between the adjacent lines.

Process block 407 may be followed by process block 409, which includes determining an endpoint based no a relative spatial characteristic between two or more of the lines. The method of determination, as with the imaging, may be based on the line strategy implemented. For example, if the line strategy is based on FIG. 2A, then the determination is based on whether and when the depth/height of the adjacent lines is equal. On the other hand, if the line strategy is based on FIG. 3A, then the determination is based on whether or when distances between two line sets are equal or when a ratio of the two distances satisfies some condition.

In addition to what parameters are analyzed to determine the endpoint, the images may be automatically analyzed by a control system running software to determine the endpoint, instead of a user manually making the determination. In such an embodiment, the software may embody a machine learning or neural network algorithm trained to recognize the desired condition, such a equal depth or equal distance. Alternatively, the algorithm may be a standard image processing algorithm using segmentation or feature recognition to make the determination of the relative spatial characteristics. In either embodiment, segmented pixel can be analyzed directly or they can be used to place edge- or line-finders to measure the line depth or distance therebetween. Subsequently, the controlling software may stop additional processing automatically.

Figure 5:
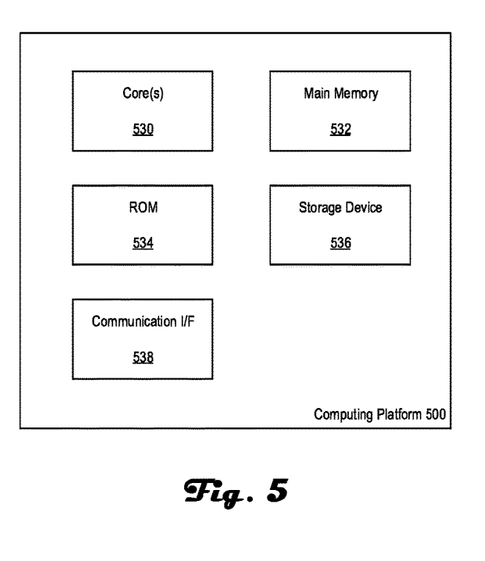
FIG. 5 is an example functional block diagram 600 in accordance with an embodiment of the present disclosure.

FIG. 5 is an example functional block diagram in accordance with an embodiment of the present disclosure. FIG. 5 is a block diagram that illustrates a computing platform 500 that an embodiment of the invention may include. The computing system 500 may be an example of computing hardware included with system 100, such controller 119. Computing platform 500 at least includes a bus (not shown) or other communication mechanism for communicating information between functional blocks of the computing platform, core(s) 530, ROM 534, Main Memory 532, Storage Device 536 and communication interface 538. Core(s) 530 may be one or more general purpose computing core or any specialized computing core used to run machine learning and neural network algorithms.

Main memory 532 may be random access memory (RAM) or other dynamic storage device coupled to the bus for storing information and instructions to be executed by core 530. Main memory 532 also may be used for storing temporary variables or other intermediate information during execution of instructions to be executed by core 530. Such instructions, when stored in non-transitory storage media accessible to core 530, render computer system 500 into a special-purpose machine that is customized to perform the operations specified in the instructions.

Computer system 500 further includes a read only memory (ROM) 534 or other static storage device coupled to bus for storing static information and instructions for core 530. A storage device 536, such as a magnetic disk or optical disk, is provided and coupled to the bus for storing information and instructions.

Computer system 500 may be coupled via the bus to a display, such as a cathode ray tube (CRT) or flat panel display, for displaying information to a user. An input device, including alphanumeric and other keys, is coupled to the bus for communicating information and command selections to core 530. Another type of user input device, such as a mouse, a trackball, or cursor direction keys for communicating direction information and command selections to core 530 and for controlling cursor movement on the display.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to core 530 executing one or more sequences of one or more instructions contained in main memory 532. Such instructions may be read into main memory 532 from another storage medium, such as storage device 536. Execution of the sequences of instructions contained in main memory 532 causes core 530 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 536. Volatile media includes dynamic memory, such as main memory 532. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise the bus. Transmission media can also take the form of acoustic or light waves, such as those generated during radio-wave and infra-red data communications.

Computer system 500 also includes a communication interface 538 coupled to the bus. Communication interface 538 provides a two-way data communication coupling to a network link that is connected to a local network. For example, communication interface 538 may be an integrated services digital network (ISDN) card, cable modem, satellite modem, or a modem to provide a data communication connection to a corresponding type of telephone line. As another example, communication interface 538 may be a local area network (LAN) card to provide a data communication connection to a compatible LAN. Wireless links may also be implemented. In any such implementation, communication interface 538 sends and receives electrical, electromagnetic or optical signals that carry digital data streams representing various types of information.

The network link 558 typically provides data communication through one or more networks to other data devices.

For example, the network link may provide a connection through local network to a host computer or to data equipment operated by an Internet Service Provider (ISP). The ISP in turn provides data communication services through the world wide packet data communication network. Computing platform 500 can send messages and receive data, including program code, through the network(s), network link and communication interface 538. In the Internet example, a server might transmit a requested code for an application program through Internet, ISP, local network and communication interface 538.

The received code may be executed by core 530 as it is received, and/or stored in storage device 536, or other non-volatile storage for later execution.

The embodiments discussed herein to illustrate the disclosed techniques should not be considered limiting and only provide examples of implementation. For example, the line-based endpoint detection as disclosed herein could include more than three lines for data redundancy and error minimization. Those skilled in the art will understand the other myriad ways of how the disclosed techniques may be implemented, which are contemplated herein and are within the bounds of the disclosure.

What is claimed is:

1. A method comprising:
   forming a plurality of lines on a top surface of a sample;
   removing, a plurality of times, material from a working surface of the sample, the working surface different than the top surface;
   imaging, a plurality of times, the sample to at least capture the plurality of lines; and
   determining an endpoint based on a relative spatial characteristic between two or more lines of the plurality of lines, wherein the relative spatial characteristic includes a ratio of a distance between a first set of lines of the plurality of lines to a distance between a second set of lines of the plurality of lines.

2. The method of claim 1, wherein determining an endpoint based on a relative spatial characteristic between two or more lines of the plurality of lines includes:
   determining when a distance between the first set of lines and/or the second set of lines equals a predetermined distance, wherein the ratio is predetermined based on the predetermined distances.

3. The method of claim 2, wherein the predetermined distance is based on an edge location of a region of interest (ROI), and wherein at least two lines of the plurality of lines are formed on the top surface to be separated by the predetermined distance at the edge location of the ROI.

4. The method of claim 1, wherein
   the first set of lines and the second set of lines share a common line.

5. The method of claim 1, wherein determining an endpoint based on a relative spatial characteristic between two or more lines of the plurality of lines includes:
   analyzing the acquired images using a machine learning algorithm to determine the endpoint based on the relative spatial characteristic.

6. The method of claim 1, wherein forming the plurality of lines on a top surface of the sample includes:
   forming a plurality of lines arranged at angles to one another, wherein a distance between at least two sets of lines is known at least at one location along their extent.

7. The method of claim 1, wherein removing, a plurality of times, material from a working surface of the sample, the working surface different than the top surface includes:
   milling the material with a focused ion beam.

8. The method of claim 1, wherein imaging the working surface a plurality of times to at least capture a profile of the plurality of lines includes:
   acquiring an electron beam image of the working surface.

9. The method of claim 1, wherein imaging, a plurality of times, the sample to at least capture a profile of the plurality of lines includes:
   imaging the sample while removing material, or
   imaging the sample between removing material.

10. The method of claim 1, wherein forming the plurality of lines on the top surface of the sample includes:
    forming the plurality of lines on the top surface of the sample so that the relative spatial characteristic aligns with an edge of a region of interest further including:
    forming at least two of the lines of the plurality of lines on the top surface at different respective angles to a third line; and
    determining a distance between the at least two lines at the edge of the ROI.

11. A method comprising:
    forming a plurality of lines on a top surface of a sample;
    removing, a plurality of times, material from a working surface of the sample, the working surface different than the top surface;
    imaging, a plurality of times, the sample to at least capture the plurality of lines; and
    determining an endpoint based on a relative spatial characteristic between two or more lines of the plurality of lines, wherein the determination includes:
    determining when two adjacent lines of the plurality of lines have a same depth in the top surface of the sample, wherein the depth of the lines is the relative spatial characteristic.

12. The method of claim 2, wherein forming the plurality of lines on a top surface of the sample includes:
    forming a series of lines arranged parallel and laterally offset, wherein at least one end of each line of the series of lines overlaps with at least one laterally offset line of the series of lines, and wherein a depth of each line where the lines overlap is the same.

13. The method of claim 12, wherein forming the series of lines includes forming each line of the series of lines using the same ion beam parameters.

14. The method of claim 11, wherein forming a plurality of lines on a top surface of a sample includes:
    forming the plurality of lines on the top surface of the sample so that the relative spatial characteristic aligns with an edge of a region of interest.

15. The method of claim 14, wherein forming the plurality of lines on the top surface of the sample so that the relative spatial characteristic aligns with an edge of a region of interest includes:
    forming at least two of the lines of the plurality of lines on the top surface so that an area of adjacent overlap aligns with the edge of the region of interest.

16. An apparatus comprising:
    an ion beam column coupled to provide an ion beam;
    an electron beam column coupled to provide an electron beam;
    a sample arranged to receive the ion and electron beams; and
    a controller coupled to control the ion and electron beams, wherein the controller includes or is coupled to non-transitory computer readable medium storing instructions that, when executed by the controller, cause the apparatus to:

form, with the ion beam, a plurality of lines on a top surface of a sample;

remove, a plurality of times with the ion beam, material from a working surface of the sample, the working surface different than the top surface;

image, a plurality of times with the electron beam, the sample to at least capture the plurality of lines; and determine an endpoint based on a relative spatial characteristic between two or more lines of the plurality of lines, wherein the relative spatial characteristic includes a ratio of a distance between a first set of lines of the plurality of lines to a distance between a second set of lines of the plurality of lines.

17. The apparatus of claim 16, wherein the code executed to determine an endpoint based on a relative spatial characteristic between two or more lines of the plurality of lines includes code that, when executed by the controller, causes the apparatus to:

determine when a distance between the first set of lines and/or the second set of lines equals a predetermined distance, wherein the ratio is predetermined based on the predetermined distances.

18. The apparatus of claim 17, wherein the predetermined distance is based on an edge location of a region of interest (ROI), and wherein at least two lines of the plurality of lines are formed on the top surface to be separated by the predetermined distance at the edge location of the ROI.

19. The apparatus of claim 16, wherein the code executed to determine an endpoint based on a relative spatial characteristic between two or more lines of the plurality of lines includes code that, when executed by the controller, causes the apparatus to:

analyze the acquired images using a machine learning algorithm to determine the endpoint based on the relative spatial characteristic.

20. An apparatus comprising:

an ion beam column coupled to provide an ion beam;

an electron beam column coupled to provide an electron beam;

a sample arranged to receive the ion and electron beams; and a controller coupled to control the ion and electron beams, wherein the controller includes or is coupled to non-transitory computer readable medium storing instructions that, when executed by the controller, cause the apparatus to:

form, with the ion beam, a plurality of lines on a top surface of a sample;

remove, a plurality of times with the ion beam, material from a working surface of the sample, the working surface different than the top surface;

image, a plurality of times with the electron beam, the sample to at least capture the plurality of lines; and determine an endpoint based on a relative spatial characteristic between two or more lines of the plurality of lines wherein the code executed to determine an endpoint based on a relative spatial characteristic between two or more lines of the plurality of lines includes code that, when executed by the controller, causes the apparatus to:

determine when two adjacent lines of the plurality of lines have a same depth in the top surface of the sample, wherein the depth of the lines is the relative spatial characteristic.

21. The apparatus of claim 16, wherein the code executed to form a plurality of lines on a top surface includes code that, when executed by the controller, causes the apparatus to:

form the plurality of lines on the top surface of the sample so that the relative spatial characteristic aligns with an edge of a region of interest.

22. The apparatus of claim 20, wherein the code executed to form a plurality of lines on a top surface includes code that, when executed by the controller, causes the apparatus to:

form a series of lines arranged parallel and laterally offset, wherein at least one end of each line of the series of lines overlaps with at least one laterally offset line of the series of lines, and wherein a depth of each line where the lines overlap is the same.

23. The apparatus of claim 16, wherein the code executed to form a plurality of lines on a top surface includes code that, when executed by the controller, causes the apparatus to:

form a plurality of lines arranged at angles to one another, wherein a distance between at least two sets of lines is known at least at one location along their extent.

* * * * *